United States Patent
Grissom

(10) Patent No.: US 8,749,234 B2
(45) Date of Patent: Jun. 10, 2014

(54) METHOD AND SYSTEM FOR DESIGNING EXCITATION PULSES FOR MAGNETIC RESONANCE IMAGING

(75) Inventor: William Grissom, Bavaria (DE)

(73) Assignee: General Electric Company, Schenectady, NY (US)

( * ) Notice: Subject to any disclaimer, the term of this patent is extended or adjusted under 35 U.S.C. 154(b) by 679 days.

(21) Appl. No.: 13/015,665

(22) Filed: Jan. 28, 2011

(65) Prior Publication Data

US 2012/0194184 A1 Aug. 2, 2012

(51) Int. Cl.
*G01V 3/00* (2006.01)
(52) U.S. Cl.
USPC .......................................... 324/314; 324/307
(58) Field of Classification Search
USPC .................... 324/314, 307, 309, 300
See application file for complete search history.

(56) References Cited

U.S. PATENT DOCUMENTS

| | | | |
|---|---|---|---|
| 6,034,528 A | 3/2000 | Heid | |
| 6,404,198 B1 * | 6/2002 | Duerk et al. | 324/314 |
| 7,046,003 B2 | 5/2006 | Hargreaves et al. | |
| 7,166,998 B2 * | 1/2007 | Magland et al. | 324/307 |
| 7,466,131 B1 | 12/2008 | Xu et al. | |
| 7,777,488 B2 | 8/2010 | Gore et al. | |
| 2010/0171499 A1 | 7/2010 | Sharp et al. | |

OTHER PUBLICATIONS

Lee et al., "Time-Optimal Design for Multidimensional and Parallel Transmit Variable-Rate Selective Excitation", Magnetic Resonance in Medicine, vol. 61, Issue 6, pp. 1471-1479, Jun. 2009.
Grissom et al., "Fast Large-Tip-Angle Multidimensional and Parallel RF Pulse Design in MRI", IEEE Transactions on Medical Imaging, vol. 28, Issue 10, pp. 1548-1559, Oct. 2009.

* cited by examiner

*Primary Examiner* — Louis Arana
(74) *Attorney, Agent, or Firm* — The Small Patent Law Group; Dean D. Small

(57) ABSTRACT

Methods and systems for designing excitation pulses for magnetic resonance imaging are provided. One method includes parameterizing spin-domain rotation parameters to define parameterized variables and defining a constrained optimization problem based on the parameterized variables. The method also includes solving the constrained optimization problem and generating parameters for the RF pulses based on the solved problem, wherein the RF pulses are one of multidimensional RF pulses on non-constant gradient trajectories or one dimensional RF pulses on non-constant gradient trajectories.

20 Claims, 5 Drawing Sheets

METHOD AND SYSTEM FOR DESIGNING EXCITATION PULSES FOR MAGNETIC RESONANCE IMAGING

BACKGROUND

The subject matter disclosed herein relates generally to magnetic resonance imaging systems, and more particularly to systems and methods for designing radio-frequency (RF) pulses for magnetic resonance imaging (MRI) systems.

MRI systems include a magnet, such as a superconducting magnet that generates a temporally constant (i.e., uniform and static) primary or main magnetic field. MRI data acquisition is accomplished by exciting magnetic moments within the primary magnetic field using transmit radio-frequency coils. For example, in order to image a region of interest, the magnetic gradient coils are energized to impose a magnetic field gradient to the primary magnetic field. Transmit radio-frequency (RF) coils are then pulsed to create RF magnetic field pulses in a bore of an MRI scanner to selectively excite a volume corresponding to the region of interest in order to acquire MR images of the region of interest using receive RF coils. During the transmission of the RF magnetic field pulses, the receive RF coils are decoupled or disabled and during reception the transmit RF coils are decoupled or disabled. In one example, these are the same coils that are switched from a transmit to a receive mode. The resultant magnetic resonance (MR) image that is generated shows the structure and/or function of the region of interest.

MR images, thus, may be created by applying currents to the gradient and RF coils according to defined pulse sequences. Selection of a pulse sequence, for example, by an operator, determines the relative appearance of different tissue types in the resultant images, emphasizing or suppressing tissue types as desired.

The RF pulse sequences are typically designed to achieve the desired characteristic for imaging. The Shinnar-Le Roux (SLR) RF pulse design algorithm is currently the most widely-used method for designing large-tip-angle one-dimensional RF pulses on constant gradient waveforms. Although the SLR RF pulse design algorithm simplifies the design of the input (RF pulse) into a linear problem, namely a design of two linear finite impulse response (FIR) filters, such that designed filters have a one-to-one correspondence to an RF pulse, and are easily inverted to obtain that pulse, the SLR algorithm is limited in design capabilities. In particular, the SLR algorithm is presently limited in that the algorithm is only capable of designing one-dimensional pulses for constant gradient trajectories. The constant gradient limitation arises because non-constant gradients require the design of filters with up to a computationally-prohibitive $2^{N_r-1}$ nonuniformly-spaced taps, the coefficients of which must be designed while using only the degrees of freedom afforded by the $N_r$ samples in the RF pulse. Thus, the SLR algorithm cannot be used for designing multidimensional or one-dimensional pulses on non-constant gradient waveforms.

BRIEF DESCRIPTION

In accordance with various embodiments, a non-transitory computer readable storage medium for designing radio-frequency (RF) pulses for a magnetic resonance imaging (MRI) system using a processor is provided. The computer readable storage medium includes instructions to command the processor to parameterize spin-domain rotation parameters to define parameterized variables and define a constrained optimization problem based on the parameterized variables. The computer readable storage medium also includes instructions to command the processor to solve the constrained optimization problem and generate parameters for the RF pulses based on the solved problem, wherein the RF pulses are one of multidimensional RF pulses on non-constant gradient trajectories or one dimensional RF pulses on non-constant gradient trajectories.

In accordance with other embodiments, a method for controlling a magnetic resonance imaging (MRI) system is provided. The method includes obtaining pulse parameters based on parameterized spin-domain rotation parameters and using the pulse parameters to generate one of multidimensional RF pulses on non-constant gradient trajectories or one dimensional RF pulses on non-constant gradient trajectories. The method also includes applying the generated pulses to RF coils of the MRI system.

In accordance with yet other embodiments, a magnetic resonance imaging (MRI) system is provided that includes an imaging portion having an imaging unit configured to acquire magnetic resonance (MR) data, wherein the imaging portion includes at least one radio-frequency (RF) coil. The MRI system also includes a processing portion having a processor configured to generate RF pulses for the RF coil by obtaining pulse parameters based on parameterized spin-domain rotation parameters and use the pulse parameters to generate one of multidimensional RF pulses on non-constant gradient trajectories or one dimensional RF pulses on non-constant gradient trajectories.

DETAILED DESCRIPTION

Figure 1:
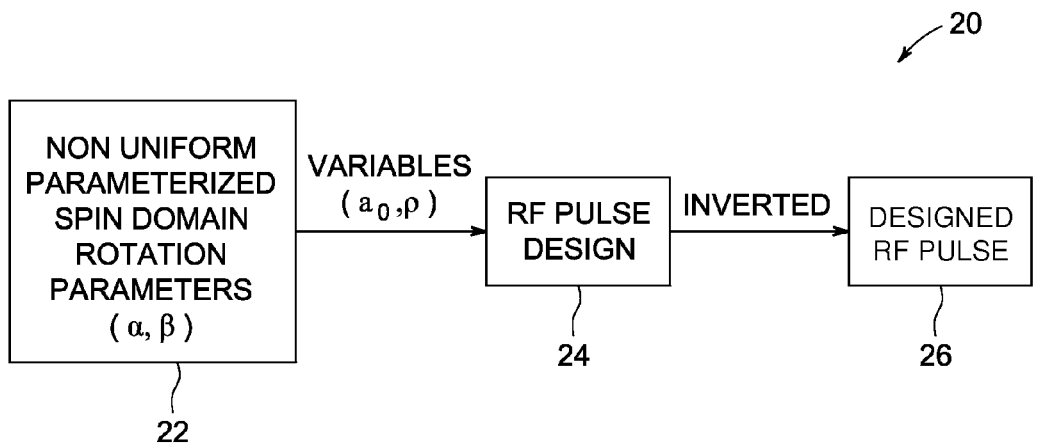
FIG. 1 is a block diagram of a radio-frequency (RF) pulse design process in accordance with various embodiments.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide systems and methods for designing radio-frequency (RF) pulses for use in magnetic resonance imaging (MRI) systems, and in particular, to pulses for multidimensional excitation in MRI systems. By practicing various embodiments, the capabilities of one-dimensional Shinnar-Le Roux (SLR) pulse design can be extended to multiple dimensions and time-varying gradient waveforms.

Specifically, in accordance with various embodiments, a parameterization of the spin-domain rotation parameters $\alpha$ and $\beta$ (under the hard-pulse or delta-function approximation for RF excitation) is provided that reduces the non-constant gradient RF design problem to $N_t+1$ variables. Once the variables are designed, these variables are inverted to obtain an RF pulse that excites the pattern predicted by the design variables. Various embodiments also provide a pulse design problem and algorithm defined in terms of the parameterized variables, wherein the solution corresponds to a realizable minimum integrated power RF pulse without designing a multidimensional minimum-phase filter.

As illustrated in FIG. 1, an RF pulse design process 20 is provided for designing RF pulses for an MRI system. For example, RF pulses may be designed for exciting RF transmission coils of the MRI systems to allow the acquisition of MR data to generate images that emphasize or suppress certain tissue types. In MRI, when a human body, or a portion thereof, is positioned in the main magnetic field, the nuclear spins that are associated with the hydrogen nuclei in tissue water become polarized. The result is that the magnetic moments that are associated with these spins become preferentially aligned along the direction of the main magnetic field, resulting in a small net tissue magnetization along that axis (commonly referred to as the z axis).

In the MRI system, gradient coils produce smaller amplitude, spatially varying magnetic fields when current is applied to these coils. Typically, gradient coils are designed to produce a magnetic field component that is aligned along the z axis (i.e., the "longitudinal axis") and that varies linearly in amplitude with position along one of the x, y or z axes. The effect of a gradient coil is to create a small ramp on the magnetic field strength and concomitantly on the resonance frequency of the nuclear spins, along a single axis. Three gradient coils with orthogonal axes are used to spatially encode the MR signal by creating a signature resonance frequency at each location in the body. The RF coils are used to create pulses of RF energy (designed by the process 20) at or near the resonance frequency of the hydrogen nuclei. These coils are used to add energy to the nuclear spin system in a controlled manner. As the nuclear spins then relax back to a rest energy state, the nuclear spins give up energy in the form of an RF signal. This signal is detected by the MRI system and is transformed into an image using any suitable reconstruction method.

The RF pulse design process 20 includes a parameterization at 22 of the spin-domain rotation parameters ($\alpha$, $\beta$) that are produced by the RF pulse. The parameters are used to design an RF pulse on a non-constant gradient by reducing the degrees of freedom as described in more detail herein. The result of the parameterization at 22 is a set of parameterized variables ($a_0$,p) in which the hard-pulse representation of the RF excitation can be equivalently expressed. The set of parameterized variables is then used in an RF pulse design at 24, which can be defined by one or more optimization problems of the various embodiments as described below. Thus, the optimization problems for RF pulse design may be defined and solved using the parameterized variables. For example, constrained optimization problems in the parameterized variables are provided with the solution corresponding to a realizable minimum integrated power RF pulse without designing a multidimensional minimum-phase filter. Thus, in various embodiments, the RF pulse design includes the designing of two linear finite impulse response (FIR) filters.

The designed filters have a one-to-one correspondence to an RF pulse and which may be inverted to obtain the RF pulse at 26.

Figure 2:
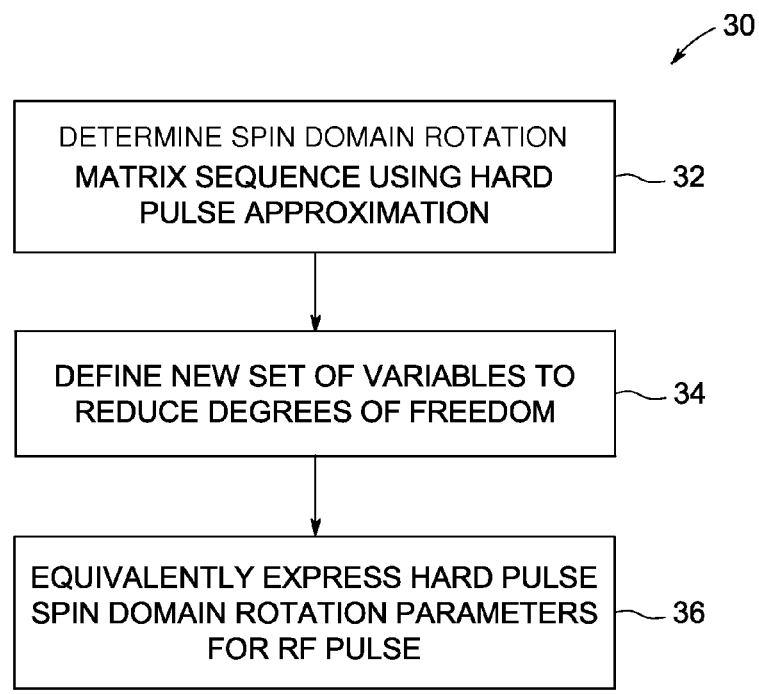
FIG. 2 is a flowchart of a method for parameterization of the spin-domain parameters in accordance with various embodiments.

More specifically, a method 30 for parameterization (e.g., non-uniform or uniform parameterization) of the spin-domain parameters ($\alpha$, $\beta$) is illustrated in FIG. 2. It should be noted that although the various embodiments may be described in connection with designing pulses on non-uniform or non-constant gradients, the pulse may be designed, for example, on uniform or constant gradient waveforms. The resulting parameters are then used as the variables for RF pulse design on time-varying and multidimensional gradients, and provide a relationship to a corresponding RF pulse. The method 30 includes determining a spin-domain rotation matrix sequence at 32 using a hard pulse approximation. For example, consider a pulse with $N_t=3$ complex samples $\{B_{1,j}\}_{j=1}^3$, then using the hard pulse approximation, the spin-domain matrix sequence for the pulse is:

$$\begin{pmatrix} \alpha \\ \beta \end{pmatrix} = (z_3 z_2 z_1)^{-1/2} \begin{pmatrix} C_3 & -S_3^* \\ S_3 & C_3 \end{pmatrix} \begin{pmatrix} 1 & 0 \\ 0 & z_3 \end{pmatrix} \quad \text{Equation 1}$$
$$\begin{pmatrix} C_2 & -S_2^* \\ S_2 & C_2 \end{pmatrix} \begin{pmatrix} 1 & 0 \\ 0 & z_2 \end{pmatrix} \begin{pmatrix} C_1 & -S_1^* \\ S_1 & C_1 \end{pmatrix} \begin{pmatrix} 1 & 0 \\ 0 & z_1 \end{pmatrix} \begin{pmatrix} 1 \\ 0 \end{pmatrix},$$

where:
$z_j = e^{-\iota \gamma \vec{G}_j \cdot \vec{x} \Delta t}$ represents the gradient-induced phase accrual at location $\vec{x}$ and time point j, and, $C_j = \cos(\gamma|B_{1,j}|\Delta t/2)$ and $S_j = \iota e^{\iota \angle B_{1,j}} \sin(\gamma|B_{1,j}|\Delta t/2)$ represent the RF-induced rotation at time point j. It should be noted that $\gamma$ is the gyromagnetic ratio and $\Delta t$ is the RF sampling period in the equations. It should be noted Equation 1 is generalized to both time-varying gradient waveforms and multidimensional excitation through the definition of $z_j$. Thereafter, defining:

$$A = (\Pi_{j=1}^{N_t} z_j^{1/2})\alpha \qquad \text{Equation 2}$$

$$B = (\Pi_{j=1}^{N_t} z_j^{1/2})\beta \qquad \text{Equation 3}$$

and multiplying out Equation 1 to expand $\alpha$ and $\beta$, results in:

$$A = C_1 C_2 C_3 - S_1 S_{2*} C_3 z_2 - S_1 C_2 S_{3*} z_2 z_3 - C_1 S_2 S_{3*} z_3 \qquad \text{Equation 4}$$

$$B = S_1 C_2 C_3 z_2 z_3 + C_1 S_2 C_3 z_3 + C_1 C_2 S_3 - S_1 S_{2*} S_3 z_2 \qquad \text{Equation 5}$$

In the case of a constant gradient pulse, $z_1$, $z_2$ and $z_3$ would be identical, and A and B would simplify to third-order polynomials in z. However, for a non-constant gradient pulse of pulse of $N_t$ samples, A and B can comprise up to $2^{N_t-1}$ terms with unique products of the $z_j$, and do not generally simplify. Accordingly, in various embodiments, to design an RF pulse on a non-constant gradient the degrees of freedom are reduced. In one embodiment, a new set of variables is defined at 34 to reduce the degrees of freedom. The new set of variable may be provided by defining $N_t+1$ new variables as:

$$a_0 = \Pi_{j=1}^{N_t} C_j, \; p_j = S_j \Pi_{i \neq j} C_i, \; j=1, \ldots, N_t, \quad \text{Equation 6}$$

Thereafter, expressing A and B in terms of $a_0$ and $p = [p_1 \ldots p_{N_t}]^T$, p can be inverted to obtain the original RF pulse using:

$$|B_{1,j}| = \frac{2}{\gamma \Delta t} \tan^{-1} \left| \frac{p_j}{a_0} \right|, \quad \text{Equation 7}$$

$$\angle B_{1,j} = \angle \left( \frac{-\iota p_j}{a_0} \right). \quad \text{Equation 8}$$

The sequence of $N_t=3$ RF rotations in Equation 1 can be equivalently expressed at 36 in terms of $(a_0, p)$ as:

$$\binom{A}{B} = \begin{pmatrix} 1 & -p_3^*/a_0 \\ p_3/a_0 & 1 \end{pmatrix} \begin{pmatrix} 1 & 0 \\ 0 & z_3 \end{pmatrix} \begin{pmatrix} 1 & -p_2^*/a_0 \\ p_2/a_0 & 1 \end{pmatrix}$$

$$\begin{pmatrix} 1 & 0 \\ 0 & z_2 \end{pmatrix} \begin{pmatrix} 1 & -p_1^*/a_0 \\ p_1/a_0 & 1 \end{pmatrix} \begin{pmatrix} 1 & 0 \\ 0 & z_1 \end{pmatrix} \binom{a_0}{0}, \quad \text{Equation 9}$$

Thus, at 36, the hard pulse spin domain rotation parameters for the RF pulse are equivalently expressed. Accordingly, Equations 4 and 5 become:

$$A = a_0 - \frac{p_1 p_2^*}{a_0} z_2 - \frac{p_1 p_3^*}{a_0} z_2 z_3 - \frac{p_2 p_3^*}{a_0} z_3, \quad \text{Equations 10 and 11}$$

$$B = p_1 z_2 z_3 + p_2 z_3 + p_3 - \frac{p_1 p_2^* p_3}{a_0^2} z_2.$$

It should be noted that $a_0$ is the DC coefficient of the A polynomial and that:

$$a_0 \approx 1 - \frac{1}{8}(\gamma \Delta t)^2 \sum_{j=1}^{N_t} |B_{1,j}|^2 \quad \text{Equation 12}$$

which states that an RF pulse with minimal integrated power that will have the maximum $a_0$ among all pulses meeting a given design criteria in some embodiments.

Thus, for a pulse of $N_t$ samples, a new set of $N_t+1$ variables $(a_0, p)$ is provided in which the pulse's hard pulse spin domain rotation parameters can be equivalently expressed.

Figure 3:
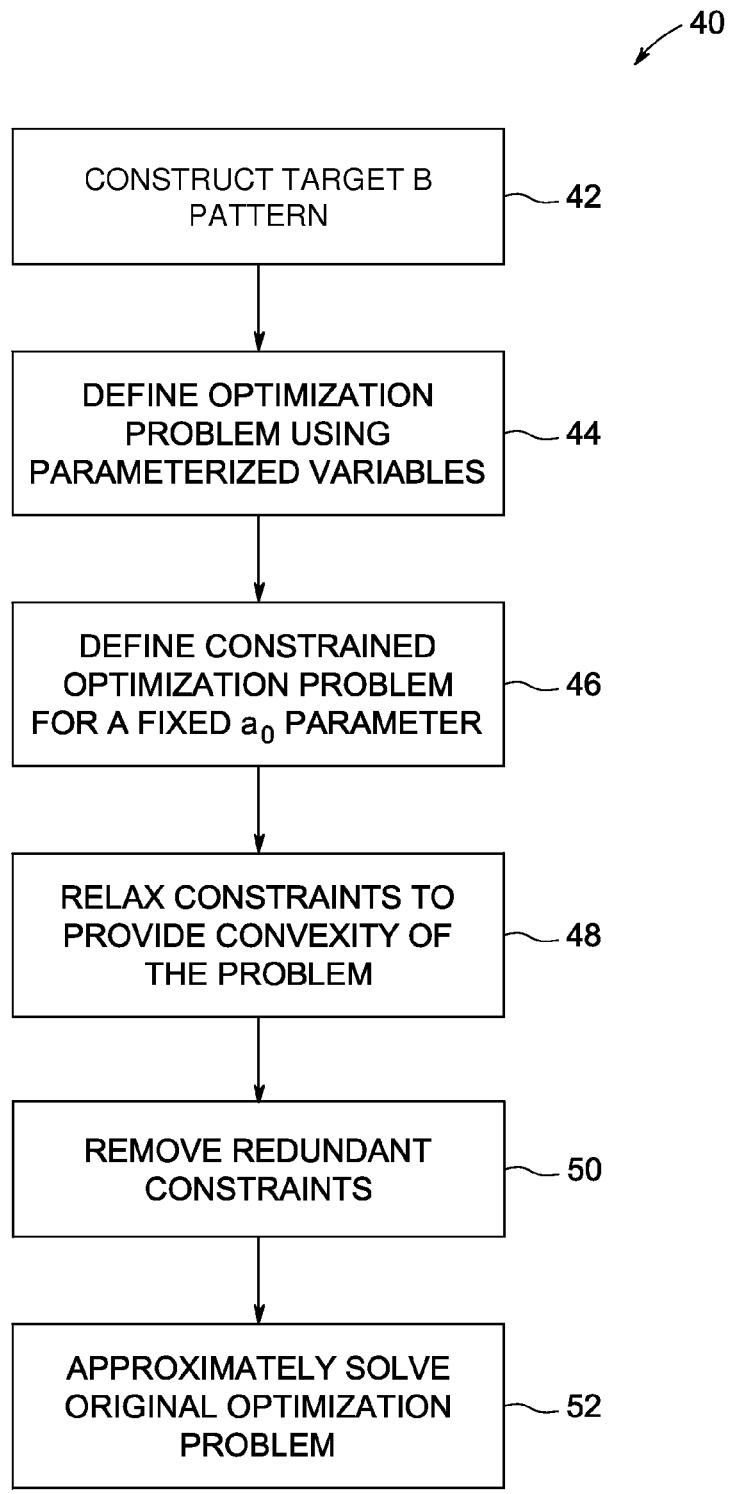
FIG. 3 is a flowchart of method for designing an RF pulse in accordance with various embodiments.

A method 40 for designing an RF pulse is illustrated in FIG. 3, which in one embodiment includes using two constrained optimization problems in the parameterized variables (determined by the method 30). It should be noted that in designing the A and B filters, the magnitudes of the filters must satisfy the rotation magnitude constraint:

$$|A(\vec{x})|^2 + |B(\vec{x})|^2 = 1 \quad \text{Equation 13}$$

The method 40 includes constructing a target B pattern at 42. For example, in one embodiment, a desired or required target B pattern for an MRI excitation is constructed using any suitable method.

Thereafter, in one embodiment, to design the $(a_0, p)$ corresponding to a minimum power multidimensional pulse, the following optimization problem is defined at 44 using the parameterized variables (which may be equivalently solved):

$$\begin{aligned} \text{maximize} \quad & a_0 \\ \text{subject to} \quad & 0 \leq a_0 \leq 1 \\ & |p_j| \leq p_{max}, \quad j=1, \ldots, N_t \\ & Ap = 0 \\ & |A_i(a_0, p)|^2 + |B_i(a_0, p)|^2 = 1, \quad i=1, \ldots, N_s \\ & |B_i^d - B_i(a_0, p)| \leq \delta_b, \quad i=1, \ldots, N_s \end{aligned} \quad \text{Equation 14}$$

where $N_s$ is the number of samples in the design grid, $B_i^d$ is the target B value at location $\vec{x}_i$, $p_{max}$ is a limit on the magnitudes of the $p_j$ and is less than or equal to 1, and may be dictated by convexity bounds for the functions $|A_i(a_0,P)|^2 + |B_i(a_0, P)|^2$ and $|B_i^d - B_i(a_0,p)|$, and $\delta_b$ is the maximum allowed ripple (to simplify notation an equiripple pulse design is assumed). The linear equality constraint $Ap=0$ can be used to express p as a weighted sum of basis functions. For example, given a basis contained in the columns of a matrix X, one could force p to lie in the space spanned by this basis by setting $A=I-X(X'X)^{-1}X'$. We hereafter assume that $A=0$. It should be noted that construction of the target pattern $B^d$ requires the flip angle $\phi$, slice thickness $\Delta x$, pass and stop band ripple levels $\delta_p$ and $\delta_s$, and the time bandwidth product (TB) of a pulse in each dimension. In each given dimension, the fractional transition width W is calculated first using:

$$W = d_\infty(\delta_p/\sin(\phi/2), \delta_s/\sin(\phi/2)) \cdot (TB)^{-1} \quad \text{Equation 15}$$

where the function $d_\infty$ an empirically derived polynomial performance measure. Given W, the location of the pass and stop band edges are given by:

$$x_p = \frac{1}{2} \Delta x (1-W) \quad \text{Equations 16 and 17}$$

$$x_s = \frac{1}{2} \Delta x (1+W),$$

and the spatial components of $B^d$ in this dimension are:

$$B_i^{d,x} = \begin{cases} 1 & |x_i| \leq x_p \\ 0 & \text{otherwise.} \end{cases} \quad \text{Equation 18}$$

For a $\pi$ pulse, $B^d$ is then scaled to a maximum of $1-\delta_p$ because the ripple cannot exceed 1, and the minimum expected passband value is $1-2\delta_p$. For smaller angles, the scaling is to $\sin(\phi/2)$.

It should be noted that the direct solution of the design problem in Equation 14 is not possible with most optimization methods because an initial feasible point that satisfies the ripple constraints on the B polynomial must be determined. To obtain an approximately feasible initial point, the following constrained optimization problem is solved at 46 for a fixed initial $a_0$:

$$\begin{aligned} \text{minimize} \quad & \sum_{i=1}^{N_s} w_i |B_i^d - B_i(a_0, p)|^2 \\ \text{subject to} \quad & |p_j| \leq p_{max}, \quad j=1, \ldots, N_t \\ & |A_i(a_0, p)|^2 + |B_i(a_0, p)|^2 = 1, \quad i=1, \ldots, N_s. \end{aligned} \quad \text{Equation 19}$$

where the $\{w_i\}_{i=1}^{N_s}$ are spatial weights that are determined by the target pass-and stop-band ripple levels, using least-squares filter design relationships. In various embodiments, solving this problem yields a solution that may not satisfy the B ripple constraints at all spatial locations, but will have only a few small ripple constraint violations for which the original ripple constraints may be adjusted to accommodate. It also should be noted that with respect to directly solving Equation 14, even if $\Sigma_{i=1}^{N_s} w_i |B_i^d - B_i(a_0, p)|^2$ and $|A_i(a_0, p)|^2 + |B_i(a_0, p)|^2$ are assumed to be convex functions of $(a_0, p)$, the rotation magnitude constraints $$|A_i(a_0, p)|^2 + |B_i(a_0, p)|^2 = 1, i = 1, \ldots, N_s \quad \text{Equation 20}$$

are not convex constraints due to the equality requirement, which prevents the use of convex optimization methods to solve the optimization problem. Accordingly, in various embodiments, these constraints are reduced or relaxed at 48 to:

$$|A_i(a_0, p)|^2 + |B_i(a_0, p)|^2 \leq 1, i = 1, \ldots, N_s \quad \text{Equation 21}$$

Thus, convexity of the problem is regained, and the goal of maximizing $a_0$ ensures that at the optimal solution the constraint will be active with equality and the resulting A and B will be valid rotations.

The optimization problem in Equation 19 (with the convex relaxation in Equation 21) in various embodiments is further simplified by recognizing that the inclusion of all $N_s$ rotation magnitude constraints is redundant. This is because $$|A(\vec{x}; a_0, p)|^2 + |B(\vec{x}; a_0, p)|^2 = a_0^2 \prod_{j=1}^{N_t} \left(1 + \frac{|p_j|^2}{a_0^2}\right), \quad \text{Equation 22}$$

i.e., the sum of squared A and B polynomials is independent of spatial location.

Thus, in various embodiments, the sum-of-squares constraint is applied at one spatial location, thereby removing redundant constraints at 50. It should be noted that by practicing various embodiments, removing the redundant constraints reduces the computational cost of enforcing the rotation magnitude constraint, and as a result the computation is dominated by simulations and gradient calculations for the B error term in Equation 19.

Thus, combining the above, the original optimization problem in Equation 14 is approximately solved at 52 using a bisection algorithm, which in various embodiments is defined as follows:

1: $a_0 \leftarrow a_0^l$ {Initialize $a_0$ to lower bound.}

2: $c_{min} \leftarrow \infty$ {Initialize minimum excitation error.}

3: repeat

4: Solve the following problem for $p$:

$$\text{minimize} \quad \sum_{i=1}^{N_s} w_i |B_i^d - B_i(p; a_0)|^2$$

$$\text{subject to} \quad |A_1(p; a_0)|^2 + |B_1(p; a_0)|^2 \leq 1$$

$$|p_j|^2 \leq p_{max}^2 \quad j = 1, \ldots, N_t.$$

5: if $\sum_{i=1}^{N_s} w_i |B_i^d - B_i(p; a_0)|^2 < c_{min}$ then

6: $c_{min} \leftarrow \sum_{i=1}^{N_s} w_i |B_i^d - B_i(p; a_0)|^2$

7: end if

8: if $\sum_{i=1}^{N_s} w_i |B_i^d - B_i(a_0, p)|^2 < 1.0001 c_{min}$ or $$max_i |B_i^d - B_i(a_0, p)| < \delta \text{ then}$$

9: $a_0^l = a_0$ {$a_0$ is too small. Update lower bound.}

10: else

11: $a_0^u = a_0$ {$a_0$ is too large. Update upper bound.}

12: end if

13: $a_0 \leftarrow \frac{1}{2}(a_0^u - a_0^l) + a_0^l$ {Set $a_0$ halfway between bounds.}

14: until $a_0 - a_0^l > 0.0001$ {Stop when $a_0$ does not change significantly}

In various embodiments, given initial lower and upper $a_0$ bounds $a_0^l$ and $a_0^u$, respectively, the algorithm finds a solution $(a_0, p)$ that either satisfies the ripple constraints everywhere or has a B error that is less than 0.0001% more than the minimum error among visited $a_0$ values. The optimization problem used in the algorithm to find the optimal $p$ for fixed $a_0$ can be solved using any suitable method, for example, the barrier method, which iteratively minimizes the objective function:

$$\Psi(p; a_0, t_b) = \qquad \qquad \text{Equation 23}$$

$$t_b \sum_{i=1}^{N_s} w_i |B_i^d - B_i(p; a_0)|^2 - \sum_{j=1}^{N_t} \log(-(|p_j|^2 - p_{max}^2)) -$$

$$\log(-(|A_1(p; a_0)|^2 + |B_1(p; a_0)|^2 - 1)),$$

In one embodiment, with respect to p, for increasing values of $t_b$, $\Psi(p; a_0, t_b)$ is minimized using Newton's method with a backtracking line search and a Quasi-Newton inverse Hessian matrix estimate. In some embodiments, an additional "or" condition is used in line 1 of the algorithm that determines the current $a_0$ to be valid if the rotation magnitude is too small (for example, if $$\sqrt{|A_1(p; a_0)|^2 + |B_1(p; a_0)|^2} < 0.9999 \Big),$$

which prevents the algorithm from stopping prematurely if the barrier method does not converge to the optimal p within the allowed iterations.

It should be noted that with the parameterization of the variables using the method 30 (shown in FIG. 2), any suitable problem definition and solution may be provided, and the method 40 is merely for illustration.

It also should be noted the barrier method used to solve the sub-problem in the algorithm described above uses the calculation of vectors of first derivatives with respect to p of norm-squared functions of $A(p; a_0)$ and $B(p; a_0)$. Once calculated, the first derivative vectors are used in a Quasi-Newton method to form line search directions. In accordance with some embodiments, the derivatives of A and B with respect to p may be calculated as described below. In particular, the norm-squared function derivatives used by the optimization algorithm are calculated by invoking the chain rule. In particular, the auxiliary forward and backward rotation parameters ($A^f$, $B^f$) and ($A^b$, $B^b$), respectively, are defined. These parameters are initialized to:

$$\begin{pmatrix} A^f \\ B^f \end{pmatrix} = \left[ \prod_{j=1}^{N_t-1} \begin{pmatrix} 1 & -p_j^*/a_0 \\ p_j/a_0 & 1 \end{pmatrix} \begin{pmatrix} 1 & 0 \\ 0 & z_j \end{pmatrix} \right] \begin{pmatrix} a_0 \\ 0 \end{pmatrix} \quad \text{Equation 24}$$

and $$\begin{pmatrix} A^b \\ B^b \end{pmatrix} = \begin{pmatrix} 1 \\ 0 \end{pmatrix}. \quad \text{Equation 25}$$

The derivatives of (A,B) with respect to $p_j$ can be expressed in terms of ($A^f$, $B^f$) and ($A^b$, $B^b$) as:

$$\frac{\partial A}{\partial p_j^{Re}} = a_0^{-1}(-B^f A^b z_j - A^f (B^b)^*)$$

$$\frac{\partial A}{\partial p_j^{Im}} = a_0^{-1}(\imath B^f A^b z_j - \imath A^f (B^b)^*)$$

$$\frac{\partial B}{\partial p_j^{Re}} = a_0^{-1}(-B^f B^b z_j - A^f (A^b)^*)$$

$$\frac{\partial B}{\partial p_j^{Im}} = a_0^{-1}(\imath B^f B^b z_j - \imath A^f (A^b)^*),$$

where derivatives with respect to the real ($p_j^{Re}$) and imaginary ($p_j^{Im}$) parts are separated due to mixed conjugation of the $p_j$ within the rotation matrices. Once these derivatives are computed and stored (e.g., in memory), the auxiliary variables are updated by multiplying the backward rotation parameters ($A^b$, $B^b$) with the gradient and RF rotation matrices for time point j, while the rotation matrices for time point j−1 are stripped off of the forward rotation parameters ($A^f$, $B^f$) via multiplication with respective inverses, which are given by:

$$\frac{1}{1+|p_j/a_0|^2} \begin{pmatrix} 1 & 0 \\ 0 & z_j^* \end{pmatrix} \begin{pmatrix} 1 & p_j^*/a_0 \\ -p_j/a_0 & 1 \end{pmatrix}. \quad \text{Equation 30}$$

Additionally, it should be noted that using Newton's method of optimization is needed to obtain a practical rate of convergence of the barrier method used to solve the subproblem in the algorithm. However, Newton's method uses the calculation of the full Hessian matrix with respect to the design variables. In various embodiments, as an alternative, an estimate of the inverse of the true Hessian can be updated after each line search using the Broyden-Fletcher-Goldfarb-Shanno (BFGS) Quasi-Newton method. That method refines a Hessian estimate after each backtracking line search using only the differences between the current and previous p and the current and previous gradients of the barrier method cost function with respect to p. Each time $t_b$ is increased in the barrier method, the BFGS Hessian inverse estimate is initialized as the inverse of the true Hessian's central diagonal for the current p, which can be efficiently computed since all terms in the A and B polynomials are linear in each coordinate $p_j$. For example, the diagonal elements of the Hessian matrix for the function $\Sigma_{i=1}^{N_s} w_i |B_i^d - B_i(a_0,p)|^2$ are given by:

$$\frac{\partial^2}{\partial (p_j^{Re})^2} \sum_{i=1}^{N_s} w_i |B_i^d - B_i(p; a_0)|^2 = \sum_{i=1}^{N_s} w_i \left| \frac{\partial B_i(p; a_0)}{\partial p_j^{Re}} \right|^2$$

$$\frac{\partial^2}{\partial (p_j^{Im})^2} \sum_{i=1}^{N_s} w_i |B_i^d - B_i(p; a_0)|^2 = \sum_{i=1}^{N_s} w_i \left| \frac{\partial B_i(p; a_0)}{\partial p_j^{Im}} \right|^2.$$

Accordingly, various embodiments may be used to design RF pulses for an MRI system. For example, a nonuniform SLR type algorithm may be provided to design particular RF pulses. Thus, various embodiments provide for directly designing large-tip-angle and spectral-spatial pulse RF waveforms in multiple dimensions and in the presence of non-constant gradients without making approximations.

It should be noted that the various embodiments may be used to design nonuniform one-dimensional RF pulses directly on VERSE'd gradient waveforms to eliminate interpolation-induced excitation errors. The various embodiments may also be used for designing flip angle schedules in alternating-TR SSFP sequences. Other multidimensional applications for various embodiments include the design of adiabatic spectral-spatial pulses via quadratic phase β polynomial design, minimum/maximum phase spectral-spatial pulse design, and radial outer-volume-suppression pulse design.

Figure 4:
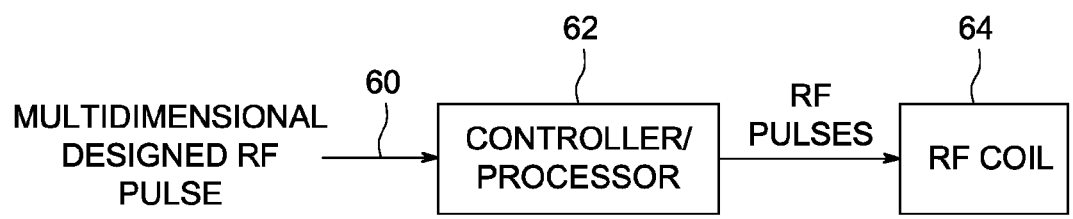
FIG. 4 is a block diagram illustrating the use of multidimensional designed RF pulses in accordance with various embodiments.

Thus, as illustrated in FIG. 4, multidimensional designed RF pulses 60 are generated and may be used by a controller/processor 62 to drive RF coils 64 of an MRI system. The multidimensional designed RF pulses 60 may be used to generate pulses for multiple dimensions and nonuniform or non-constant gradient trajectories.

Figure 5:
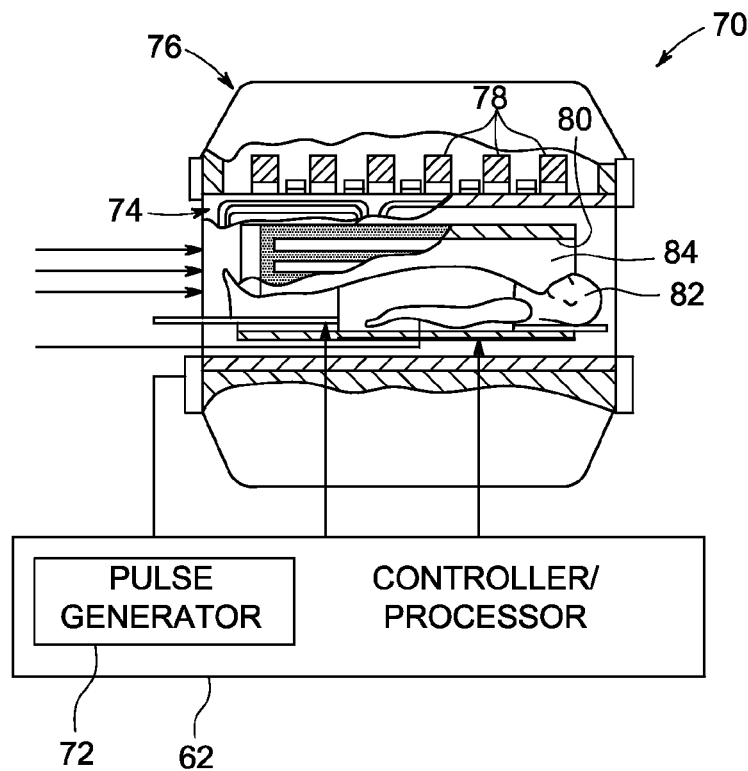
FIG. 5 is a schematic block diagram of a portion of a magnetic resonance imaging (MRI) in accordance with various embodiments.

As shown in FIG. 5, the controller/processor 62 may form part of an MRI system 70. The controller/processor 62 may also control other operations or generate other MRI signals for controlling the MRI system 70. The controller/processor 62 may be an type of processing unit, for example, a CPU, and includes a pulse generator module 72 configured to generate one or more pulses designed in accordance with various embodiments (or other pulses).

In the MRI system 60, a gradient coil assembly 74 forms part of a magnet assembly 76 that includes a polarizing magnet 78 and a whole-body RF coil 80. A patient 82 may be positioned within a cylindrical patient imaging volume 84 of the magnet assembly 76. The controller/processor 62 produces pulses that may be amplified by an RF amplifier (not shown) and used to drive the RF coil 80. The resulting signals emitted by the excited nuclei in the patient 82 may be sensed by the same RF coil 80 and preamplified. The amplified MR signals are demodulated, filtered and digitized in the receiver section of the transceiver and may be used to form MR images.

Figure 6:
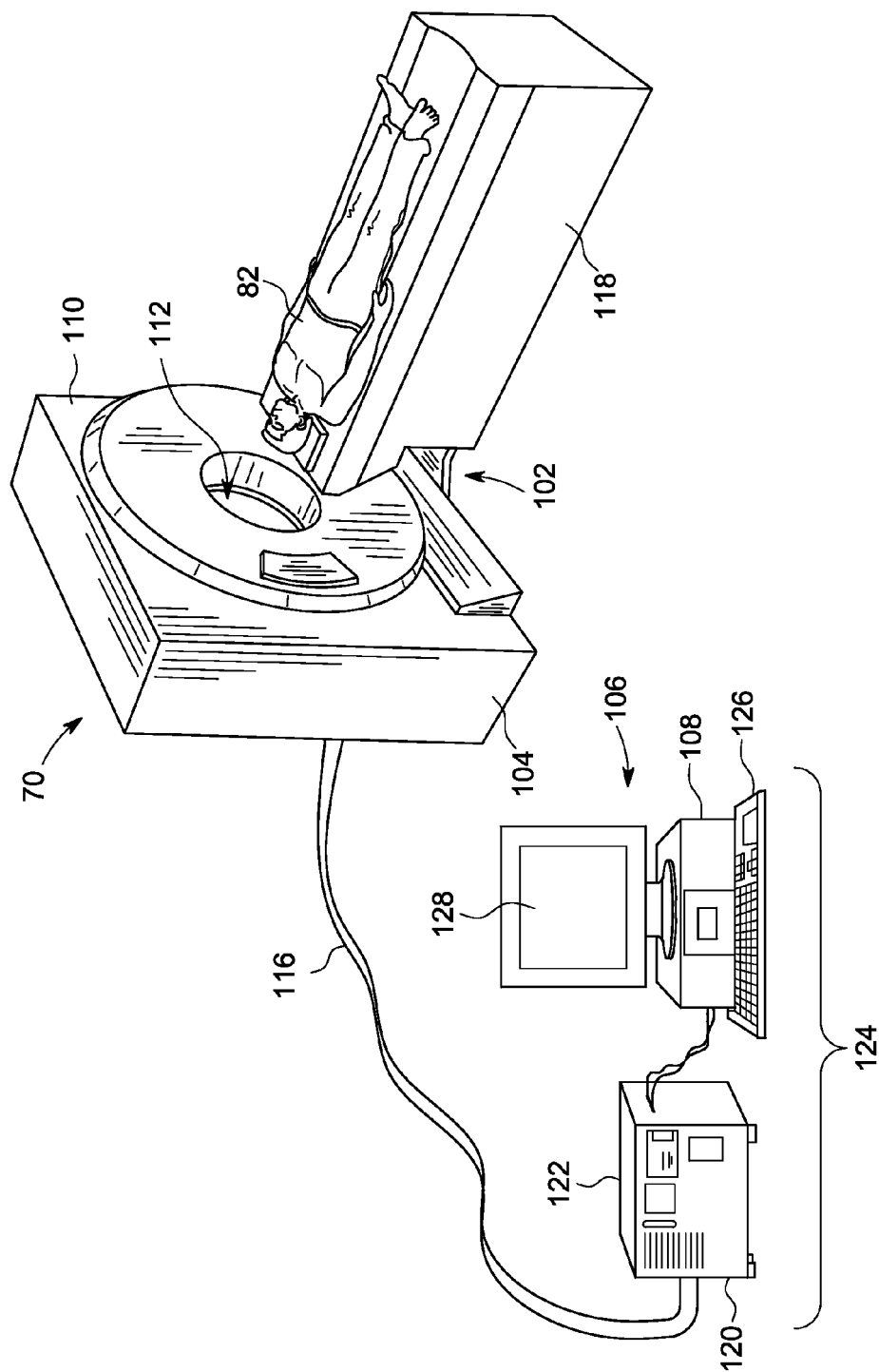
FIG. 6 is a pictorial view of an MRI system in accordance with various embodiments may be implemented.
Figure 7:
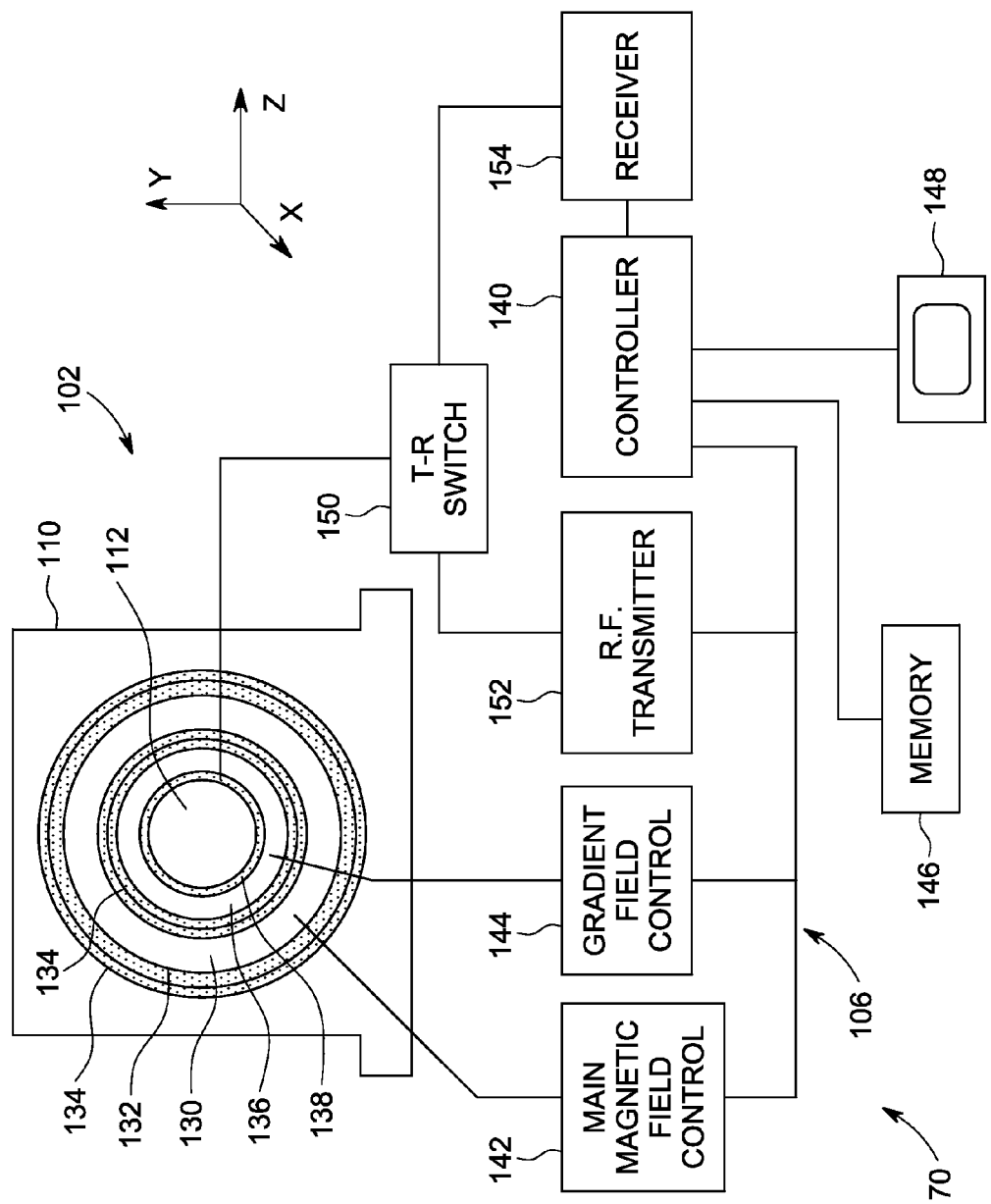
FIG. 7 is a schematic block diagram illustrating the MRI system of FIG. 6.

The MRI system 70 may be embodied as illustrated in FIGS. 6 and 7. The MRI system 70 includes an imaging portion 102 having an imaging unit 104 (e.g., imaging scanner) and a processing portion 106 that may include a processor 108 or other computing or controller device, which includes the controller/processor 62 (shown in FIG. 5). In particular, the imaging unit 104 enables the MRI system 70 to scan the patient 82 to acquire image data, which may be image data of all or a portion of the object or patient 82. The imaging unit 104 includes a gantry 110 that includes one or more imaging components (e.g., magnets or magnet windings within the gantry 110) that allow acquisition of the image data. In multi-modality imaging systems, in addition to the magnet(s) for magnetic resonance imaging, an x-ray source and detector for computed-tomography imaging, or gamma cameras for nuclear medicine imaging may be provided. The imaging components produce signals that represent image data that is communicated to the processing portion 106 via a communication link 116 that may be wired or wireless. It should be noted that the signals may be configured in different protocols, etc. It should also be noted that during an imaging scan by the imaging unit 104, the gantry 110 and the imaging components mounted thereon or therein may remain stationary or rotate about or along a center of rotation defining an examination axis through a bore 112. The patient 82 may be positioned within the gantry 110 using, for example, a motorized table 118.

Thus, in operation an output of one or more of the imaging components is transmitted to the processing portion 106, and vice versa, which for example, may include, transmitting signals to or from the processor 108 through a control interface 120. The processor 108 also may generate control signals for controlling the position of the motorized table 118 or imaging components based on, for example, user inputs or a predetermined scan. During a scan, image data, such as magnetic resonance image data from the imaging components may be communicated to the processor 108 through a data interface 122 via the control interface 120. The processor 108 and associated hardware and software used to acquire and process data may be collectively referred to as a workstation 124. The workstation 124 includes user input devices, such as a keyboard 126 and/or other input devices such as a mouse, a pointer, and the like, and a monitor 128. The monitor 128 displays image data and may accept input from a user if a touchscreen is available.

For illustrative purposes only, the MRI system 70 may be implemented as shown in FIG. 7, which generally includes the imaging portion 102 and the processing portion 106 that may include a processor or other computing or controller device as described herein. The MRI system 70 generally includes within the gantry 110 a superconducting magnet 130 formed from coils, which may be supported on a magnet coil support structure. A helium vessel 132 (also referred to as a cryostat) surrounds the superconducting magnet 130 and may be filled with liquid helium. The liquid helium may be used to cool a coldhead sleeve and/or a thermal shield.

Thermal insulation 134 is provided surrounding the outer surface of the helium vessel 132 and the inner surface of the superconducting magnet 130. A plurality of magnetic gradient coils 136 are provided inside the superconducting magnet 130 and an RF transmit coil 138 is provided within the plurality of magnetic gradient coils 136.

In some embodiments, the RF transmit coil 138 may be replaced with a transmit and receive coil. The components within the gantry 110 generally form the imaging portion 102. It should be noted that although the superconducting magnet 130 is a cylindrical shape, other shapes of magnets can be used.

The processing portion 106 generally includes a controller 140, a main magnetic field control 142, a gradient field control 144, a memory 146, a display device 148, a transmit-receive (T-R) switch 150, an RF transmitter 152 and a receiver 154.

In operation, a body of an object, such as the patient 82 (shown in FIGS. 5 and 6) or a phantom to be imaged, is placed in the bore 112 on a suitable support, for example, a patient table. The superconducting magnet 130 produces a uniform and static main magnetic field Bo across the bore 112. The strength of the electromagnetic field in the bore 112 and correspondingly in the patient 82, is controlled by the controller 140 via the main magnetic field control 142, which also controls a supply of energizing current to the superconducting magnet 130.

The magnetic gradient coils 136, which include one or more gradient coil elements, are provided so that a magnetic gradient can be imposed on the magnetic field Bo in the bore 112 within the superconducting magnet 130 in any one or more of three orthogonal directions x, y, and z. The magnetic gradient coils 136 are energized by the gradient field control 144 and are also controlled by the controller 140.

The RF transmit coil 138, which may include a plurality of coils, is arranged to transmit magnetic pulses (designed according to one or more embodiments) and/or optionally simultaneously detect MR signals from the patient 82 if receive coil elements are also provided, such as a surface coil configured as an RF receive coil. The RF receive coil may be of any type or configuration, for example, a separate receive surface coil. The receive surface coil may be an array of RF coils provided within the RF transmit coil 138.

The RF transmit coil 138 and the receive surface coil are selectably interconnected to one of the RF transmitter 152 or receiver 154, respectively, by the T-R switch 150. The RF transmitter 152 and T-R switch 150 are controlled by the controller 140 such that RF field pulses or signals are generated by the RF transmitter 152 and selectively applied to the patient 82 for excitation of magnetic resonance in the patient 82. While the RF excitation pulses are being applied to the patient 82, the T-R switch 150 is also actuated to disconnect the receive surface coil from the receiver 154.

Following application of the RF pulses, the T-R switch 150 is again actuated to disconnect the RF transmit coil 138 from the RF transmitter 152 and to connect the receive surface coil to the receiver 154. The receive surface coil operates to detect or sense the MR signals resulting from the excited nuclei in the patient and communicates the MR signals to the receiver 154. These detected MR signals are in turn communicated to the controller 140. The controller 140 includes a processor (e.g., image reconstruction processor), for example, that controls the processing of the MR signals to produce signals representative of an image of the patient 82.

The processed signals representative of the image are also transmitted to the display device 148 to provide a visual display of the image. Specifically, the MR signals fill or form a k-space that is Fourier transformed to obtain a viewable image. The processed signals representative of the image are then transmitted to the display device 148.

The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as an optical disk drive, solid state disk drive (e.g., flash RAM), and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), application specific integrated circuits (ASICs), logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program, which may form part of a tangible non-transitory computer readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A non-transitory computer readable storage medium for designing radio-frequency (RF) pulses for a magnetic resonance imaging (MRI) system using a processor, the computer readable storage medium including instructions to command the processor to:
   parameterize spin-domain rotation parameters to define parameterized variables;
   define a constrained optimization problem based on the parameterized variables;
   solve the constrained optimization problem; and
   generate parameters for the RF pulses based on the solved problem in which a hard pulse representation of an RF excitation is equivalently expressible, wherein the RF pulses are one of multidimensional RF pulses on non-constant gradient trajectories or one dimensional RF pulses on non-constant gradient trajectories.

2. The non-transitory computer readable storage medium of claim 1, wherein the instructions command the processor to relax a number of constraints in the constrained optimization problem to provide convexity.

3. The non-transitory computer readable storage medium of claim 2, wherein the instructions command the processor to reduce the number of constraints by removing redundant constraints.

4. The non-transitory computer readable storage medium of claim 1, wherein the instructions command the processor to solve the constrained optimization problem by approximately solving an original optimization problem.

5. The non-transitory computer readable storage medium of claim 1, wherein the instructions command the processor to define the constrained optimization problem for a fixed initial parameter.

6. The non-transitory computer readable storage medium of claim 1, wherein the instructions command the processor to calculate a fractional transition width in each of a plurality of spatial dimensions, and thereafter calculating pass and stop-band edges, in order to obtain a target B pattern for the constrained optimization problem.

7. The non-transitory computer readable storage medium of claim 1, wherein the instructions command the processor to use a hard pulse approximation generalized in time-varying gradient waveforms and to multiple dimensions.

8. The non-transitory computer readable storage medium of claim 1, wherein the instructions command the processor to generate the parameters for multidimensional RF pulses.

9. The non-transitory computer readable storage medium of claim 1, wherein the instructions command the processor to generate the parameters for RF pulses applied with one-dimensional pulses on non-constant gradient waveforms.

10. The non-transitory computer readable storage medium of claim 1, wherein the instructions command the processor to parameterize spin-domain rotation parameters by determining a spin-domain rotation matrix sequence using hard pulse approximation, wherein the spin-domain rotation matrix sequence includes a variable representing a gradient-induced phase accrual.

11. The non-transitory computer readable storage medium of claim 1, wherein the defined parameterized variables are based on a reduced number of degrees of freedom.

12. The non-transitory computer readable storage medium of claim 11, wherein the instructions command the processor to equivalently express hard pulse spin domain rotations parameters for the RF pulses using a redefined set of variables determined from the parameterized variables.

13. The non-transitory computer readable storage medium of claim 1, wherein the instructions command the processor to define the parameterized variables based on:

$a_0 = \Pi_{j=1}^{N_t} C_j,$ $P_j = S_j \Pi_{i \neq j} C_i; j=1, \ldots, N_t,$ where:

$C_j = \cos(\gamma|B_{1,j}|\Delta t/2)$ and $S_j = \iota e^{\iota \angle B_{1,j}} \sin(\gamma|B_{1,j}|\Delta t/2)$, wherein A and B correspond to the parameterized spin-domain rotation parameters, $C_j$ and $S_j$ represent an RF-induced rotation at a time point j, $\gamma$ is a gyromagnetic ratio, and $\Delta t$ is an RF sampling period.

14. The non-transitory computer readable storage medium of claim 1, wherein the instructions command the processor to define the constrained optimization problem as:

$$\begin{aligned}
\text{maximize} \quad & a_0 \\
\text{subject to} \quad & 0 \leq a_0 \leq 1 \\
& |p_j| \leq p_{max}, \quad j = 1, \ldots, N_t \\
& Ap = 0 \\
& |A_i(a_0, p)|^2 + |B_i(a_0, p)|^2 = 1, \quad i = 1, \ldots, N_s \\
& |B_i^d - B_i(a_0, p)| \leq \delta_b, \quad i = 1, \ldots, N_s,
\end{aligned}$$

where $p = [P_1 \ldots P_{N_t}]^T$, $N_s$ is the number of samples in the design grid, $B_i^d$ is the target B value at location $\vec{\chi}_i$, $P_{max}$ is a limit on the magnitudes of the $p_j$ and is less than or equal to 1, defined by convexity bounds for the functions $|A_i(a_0, p)|^2 + |B_i(a_0, p)|^2$ and $|B_i^d - B_i(a_0, P)|$, $\delta_b$ is the maximum allowed ripple, and A and B correspond to the parameterized spin-domain rotation parameters.

15. A method for controlling a magnetic resonance imaging (MRI) system, the method comprising:

obtaining pulse parameters based on parameterized spin-domain rotation parameters;

using the pulse parameters, and a hard pulse representation generalized to time-varying gradient waveforms and multidimensional excitation, by defining a gradient-induced phase accrual, to generate one of multidimensional radio-frequency (RF) pulses on non-constant gradient trajectories or one-dimensional RF pulses on non-constant gradient trajectories; and applying the generated pulses to RF coils of the MRI system.

16. The method of claim 15, wherein the pulse parameters are based on nonuniform parameterized spin-domain rotation parameters.

17. The method of claim 15, wherein the multidimensional RF pulses are nonuniform Shinnar-Le Roux RF pulses.

18. A magnetic resonance imaging (MRI) system comprising:

an imaging portion having an imaging unit configured to acquire magnetic resonance (MR) data, wherein the imaging portion includes at least one radio-frequency (RF) coil; and a processing portion having a processor configured to generate RF pulses for the RF coil by obtaining pulse parameters based on parameterized spin-domain rotation parameters and to use the pulse parameters, and a hard pulse representation generalized to time-varying gradient waveforms and multidimensional excitation, by defining a gradient-induced phase accrual, to generate one of multidimensional RF pulses on non-constant gradient trajectories or one dimensional RF pulses on non-constant gradient trajectories.

19. The MRI system of claim 18, wherein the processing portion is further configured to use the pulse parameters to generate one of multidimensional RF pulses or one-dimensional RF pulses on constant or non-constant gradient waveforms.

20. The MRI system of claim 18, wherein the multidimensional RF pulses are nonuniform Shinnar-Le Roux RF pulses or uniform Shinnar-Le Roux RF pulses.

* * * * *